(12) United States Patent
Hsieh et al.

(10) Patent No.: US 7,473,119 B2
(45) Date of Patent: Jan. 6, 2009

(54) ELECTRICAL CONNECTOR ASSEMBLY WITH PICK UP CAP

(75) Inventors: Fu-Pin Hsieh, Tu-Cheng (TW); Fang-Jwu Liao, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/732,759

(22) Filed: Apr. 3, 2007

(65) Prior Publication Data
US 2007/0232114 A1    Oct. 4, 2007

(30) Foreign Application Priority Data
Apr. 3, 2006   (TW) .............................. 95205560 U

(51) Int. Cl.
*H01R 4/50* (2006.01)
(52) U.S. Cl. ..................................... 439/342; 439/41
(58) Field of Classification Search ................ 439/940, 439/681, 680, 41
See application file for complete search history.

(56) References Cited

U.S. PATENT DOCUMENTS 5,839,918 A * 11/1998 Matsuoka .................... 439/526
6,554,624 B1 * 4/2003 Yu .............................. 439/135
6,875,022 B2 * 4/2005 Ma .............................. 439/41
6,991,960 B2 * 1/2006 Howarth ..................... 438/106
7,140,890 B1 * 11/2006 Ju .............................. 439/135

* cited by examiner

*Primary Examiner*—Tho D Ta
*Assistant Examiner*—Travis Chambers
(74) *Attorney, Agent, or Firm*—Wei Te Chung

(57) ABSTRACT

An electrical connector assembly includes an electrical connector, a pick up cap (13) and at least one aligning key (14). The electrical connector has a base surrounded by spaced rigid walls (112) so as to form a receiving cavity (111) adapted to receive an IC package. The at least one aligning key is attached to the base, and has at least a part thereof configured to laterally invade the receiving cavity. The pick up cap is assembled onto the electrical connector, and has a receptacle (1321) defined thereon for receiving the at least one aligning key. Since the pick up cap forms the receptacle adapted for receiving the aligning keys, the pick up cap can be assembled onto the electrical connector, and securely held in position by the engagement of the receptacle of the pick up cap and the aligning key of the electrical connector.

5 Claims, 4 Drawing Sheets

ELECTRICAL CONNECTOR ASSEMBLY WITH PICK UP CAP

BACKGROUND OF THE INVENTION

1. Field of the Invention

The present invention relates to the art of electrical connectors, and more particularly to an electrical connector assembly including a pick up cap with its shape in compliance with a socket body.

2. Description of the Related Art

One conventional electrical connector assembly is shown in FIG. 4. The electrical connector assembly includes an electrical connector having an insulative body 2 with spaced rigid walls 23 fixably attached to respective corners so as to define a substantially rectangular receiving space 24 for receiving an IC package (not shown), and a pick up cap 3 having its shape in compliance with the insulative body 2 for engaging with the insulative body 2 of the electrical connector. A pair of aligning keys 5 and 6, having a predetermined height thereof, is often attached to the insulative body 2, with its function of ensuring that the IC package is correctly mounted onto the electrical connector.

A problem, however, with the electrical connector assembly is that such a pick up cap 3 can not be assembled onto the insulative body 2 of the electrical connector due to the existence of the aligning keys 5 and 6. Further, the pick up cap 3 can not be held in position by side edges 32 formed to engage with a free region defined between spaced rigid walls 23 of the electrical connector. Therefore, there is a need to provide a new electrical connector assembly to resolve the above-mentioned shortcomings.

SUMMARY OF THE INVENTION

An electrical connector assembly according to an embodiment of the present invention includes an electrical connector, a pick up cap and at least one aligning key. The electrical connector has a base surrounded by rigid walls so as to form a receiving cavity adapted to receive an IC package. The at least one aligning key is attached to the base, and has at least a part thereof configured to laterally invade the receiving cavity. The pick up cap is assembled onto the electrical connector, and has a receptacle defined thereon for receiving the at least one aligning key. As compared with the prior art, since the pick up cap forms the receptacle adapted for receiving the aligning keys, the pick up cap can be assembled onto the electrical connector, and securely held in position by the engagement of the receptacle of the pick up cap and the aligning key of the electrical connector.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
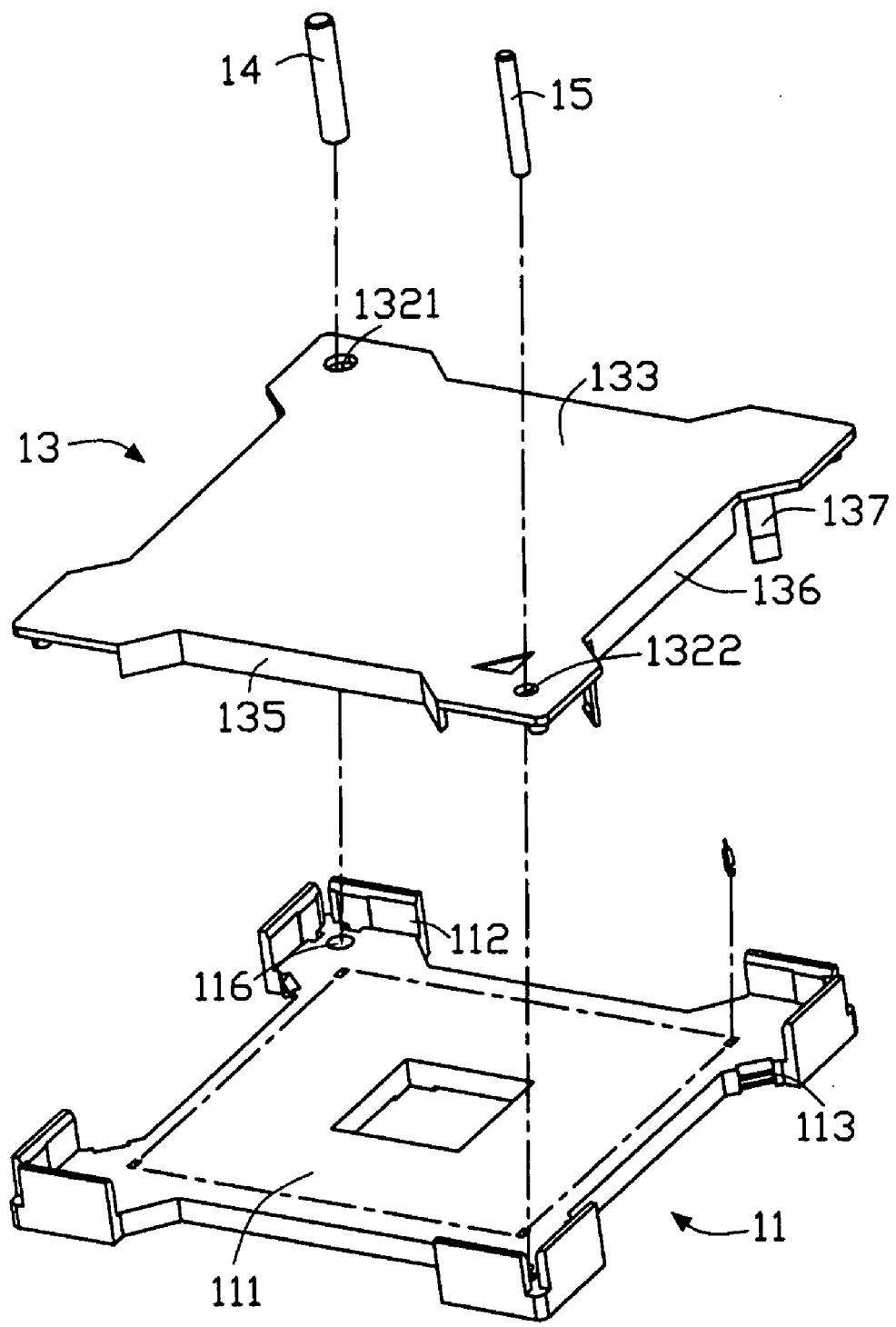
FIG. 1 is an exploded, perspective view of an electrical connector assembly according to a preferred embodiment of the present invention.
Figure 2:
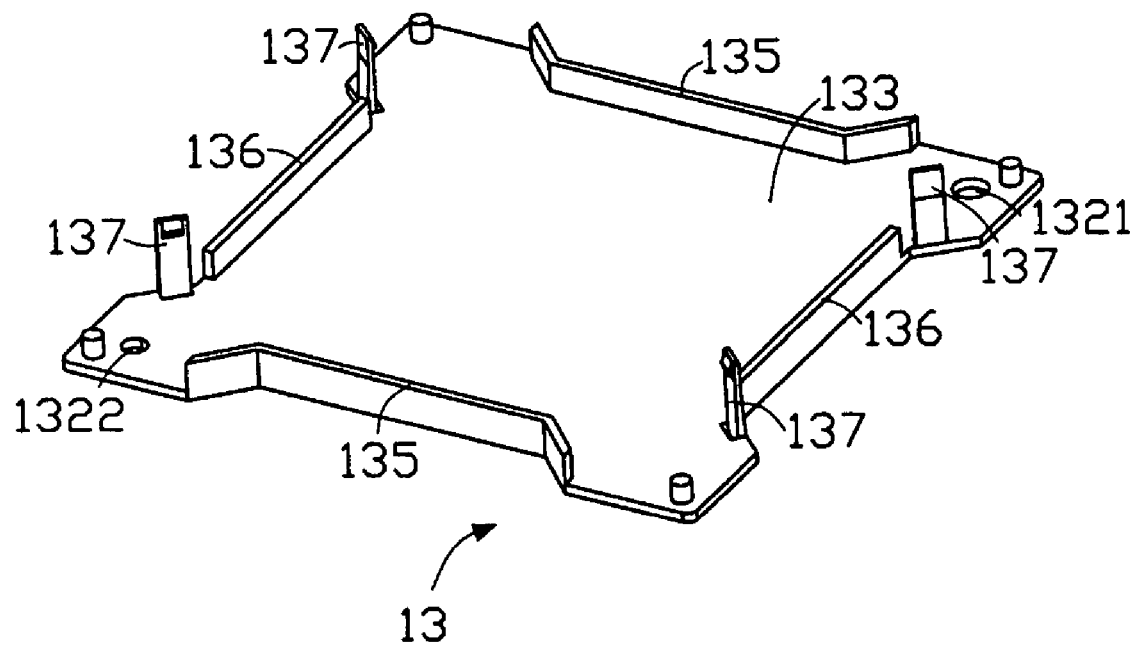
FIG. 2 is another perspective view of a pick up cap of FIG. 1.
Figure 3:
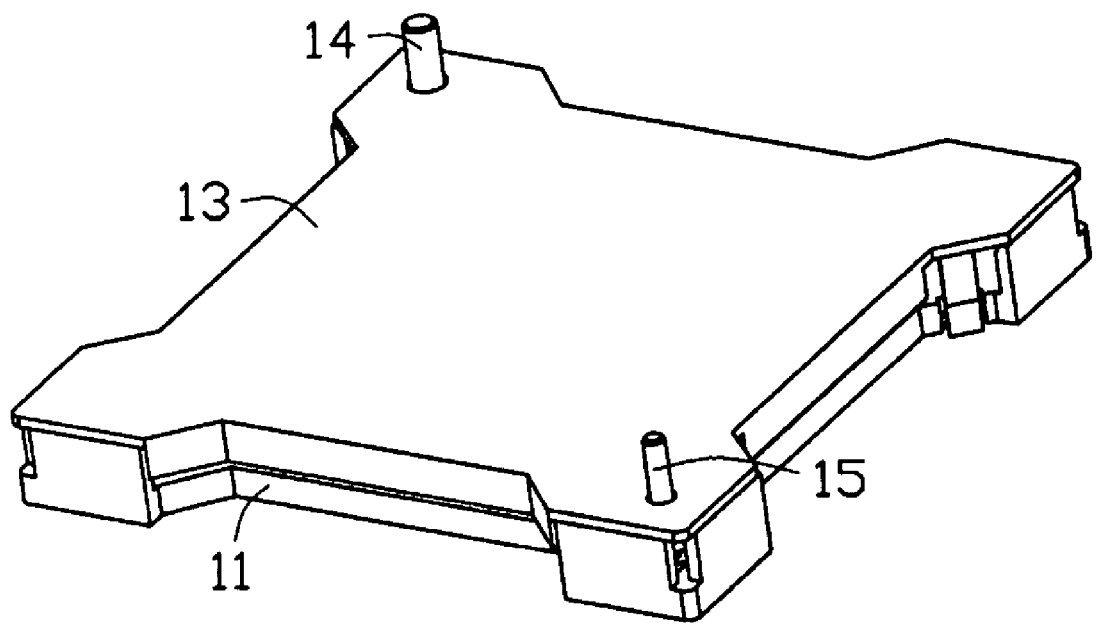
FIG. 3 is an assembled, perspective view of the electrical connector assembly of FIG. 1.
Figure 4:
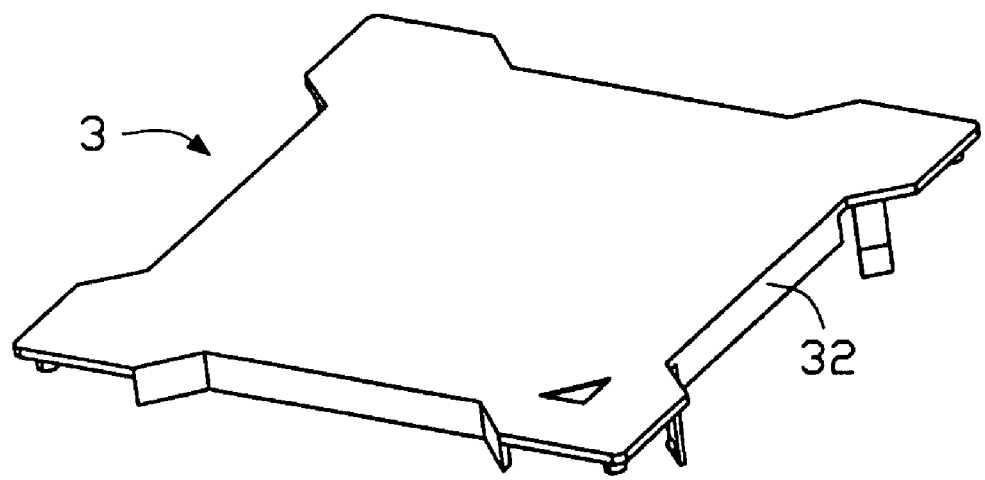
FIG. 4 is an exploded, perspective view of a conventional electrical connector assembly.
Figure 4:
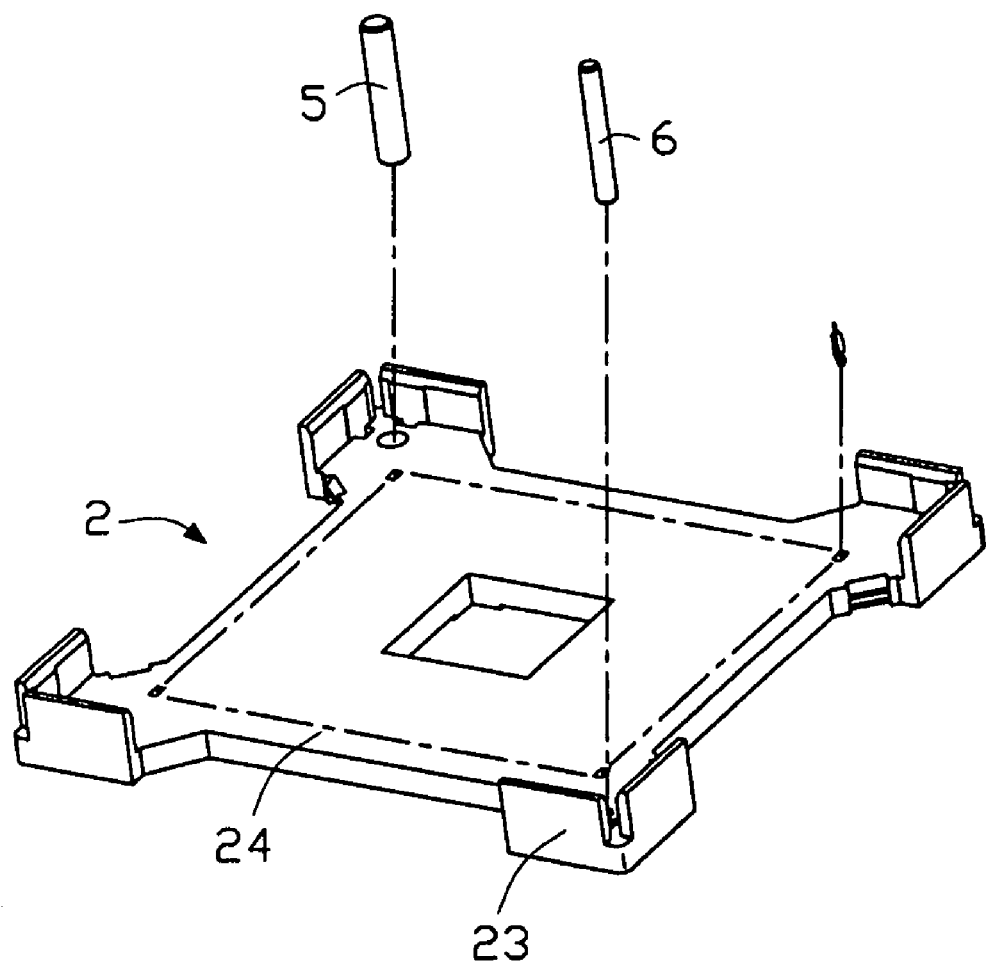

Referring to FIGS. 1 to 3, an electrical connector assembly according to the preferred embodiment of the present invention includes an electrical connector, a pick up cap 13, and a pair of aligning keys 14 and 15. The electrical connector includes an insulative body or base 11 with spaced rigid walls 112 surrounded thereby to form a rectangular receiving cavity 111 to receive an IC package (not shown). In this embodiment, the rigid walls 112 are integrally attached to respective corners of the insulative body 11. The electrical connector further includes a pair of blind holes 116 diagonally disposed on the insulative body with respect to a center point of the rectangular receiving cavity 111, and adapted for identical or different aligning keys 14 and 15 to be inserted therein. A pair of aligning keys 14 and 15, each with a predetermined height, is detachably attached to the base 11, and each has at least a part thereof configured to laterally invade the receiving cavity 111 of the electrical connector. In this embodiment, the aligning keys 14 and 15 are insertable into the blind holes 116 wholly defined on the receiving cavity 111 of the electrical connector. However, in alternative embodiments, the aligning keys may be integrally attached to the base 11, and include a part thereof laterally invading the receiving cavity 111 of the electrical connector while having a remainder attached to the rigid walls 112 of the electrical connector.

The pick up cap 13 is engagably assembled onto the electrical connector, and has a top planar surface 133 for being sucked by a suction nozzle (not shown). The pick up cap 13 includes a plurality of resilient arms 137 engagable with locking portions 113 defined on the base 11 of the electrical connector, and side edges 135 and 136 formed on an outer periphery of the pick up cap 13 for engaging a free region defined between the rigid walls 112 of the electrical connector so as to commonly form an enclosure between the pick up cap 13 and the electrical connector.

The pick up cap 13 further includes a receptacle, such as in forms of a pair of through holes, for receiving the respective aligning keys 14 and 15, such that the aligned keys 14 and 15 each with the predetermined height are to penetrate through the through holes 1321 and 1322 of the pick up cap 13 so as to have end portion thereof exposed out of the top planar surface 133 of the pick up cap 13. Through the arrangement of the through holes 1321 and 1322 of the pick up cap 13 and the aligning keys 14 and 15 of the electrical connector, the pick up cap 13 can also be securely held on the electrical connector. It should be noted that, in other embodiments, the pick up cap 13 may include any suitable form of a receptacle, such as one receptacle defined by a plurality of solid pieces combined to form a receiving space and configured to protrude from the top planar surface 133 of the pick up cap 13, other than the through hole of this embodiment. As compared with the prior art, since the pick up cap 13 forms the receptacle adapted for receiving the aligning keys 14 and 15, the pick up cap 13 can be assembled onto the electrical connector, and securely held in position by the engagement of the receptacle of the pick up cap 13 and the aligning keys 14 and 15 of the electrical connector.

Referring to FIGS. 1 and 3, in assembly, the pick up cap 13 is engagably assembled onto the electrical connector by its side edges 135 and 136 engaging with the free region defined between the rigid walls 112 of the electrical connector, the resilient arms 137 retained within the locking portions 113 of the base 11 of the electrical connector, and the aligning keys 14 and 15 extending into the through holes 1321 and 1322 of the pick up cap 13 to be exposed out of the top surface 133 of the pick up cap 13.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector assembly comprising:
    an electrical connector having an insulative housing surrounded by rigid walls so as to form a receiving cavity adapted to receive an IC package;
    at least one aligning key attached to the insulative housing, said at least one aligning key having at least a part thereof configured to laterally invade the receiving cavity; and
    a pick up cap assembled onto the electrical connector, the pick up cap defining a through hole for receiving said at least one aligning key; wherein the insulative housing defining at least one blind hole in the direction of the corner of the insulative housing, and wherein at least one through hole is correspondingly formed at the diagonal of the pick up cap.

2. The electrical connector assembly as claimed in claim 1, wherein the aligning key extends through the through hole and beyond an upper face of the pick up cap.

3. An electrical connector assembly comprising:
    an insulative housing having a base and the insulative housing including at least one aligning key at a corner of the base; and
    a pick up cap latchably assembled to the insulative housing and comprising a main portion and some resilient arms extending from the main portion toward the electrical connector to latch with the insulative housing; and wherein
    the pick up cap defining at least one hole for receiving said at least one aligning key; wherein
    the insulative housing defines at least one blind hole in the direction of the diagonal of the corner of the insulative housing, and wherein at least one hole is correspondingly formed at the diagonal of the main portion of the pick up cap.

4. An electrical connector assembly comprising:
    an electrical connector having a base a plurality of walls so as to form a receiving cavity adapted to receive an IC package;
    at least one aligning key extending upwardly from the base, said at least one aligning key having at least a part thereof configured to occupy a portion of the receiving cavity; and
    a pick up cap assembled onto the electrical connector, the pick up cap defining a recess for receiving said at least one aligning key; wherein
    the aligning key extends through the recess and beyond both an upper face of the pick up cap and an uppermost portion of the base wherein the base defining at least one blind hole in the direction of the diagonal of the corner of the base, and wherein at least one through hole is correspondingly formed at the diagonal of the pick up cap.

5. The electrical connector assembly as claimed in claim 4, wherein said aligning key is distance from any of the walls.

* * * * *